(12) United States Patent
Narwankar et al.

(10) Patent No.: US 6,534,360 B2
(45) Date of Patent: Mar. 18, 2003

(54) PROCESS FOR DEPOSITING LAYERS ON A SEMICONDUCTOR WAFER

(75) Inventors: Pravin Narwankar, Sunnyvale, CA (US); Jun Zhao, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/826,711

(22) Filed: Apr. 4, 2001

(65) Prior Publication Data

US 2002/0146915 A1 Oct. 10, 2002

(51) Int. Cl.⁷ .......................................... H01L 21/8242
(52) U.S. Cl. ...................... 438/253; 438/396; 438/250; 438/393
(58) Field of Search ................... 438/253–256, 438/396–399

(56) References Cited

U.S. PATENT DOCUMENTS

| 5,347,696 | A | * | 9/1994 | Willer et al. ................. 216/6 |
| 5,668,054 | A | * | 9/1997 | Sun et al. ................. 438/653 |
| 5,930,584 | A | * | 7/1999 | Sun et al. ................. 438/240 |
| 6,177,305 | B1 | * | 1/2001 | Hornback et al. ......... 438/240 |
| 6,238,964 | B1 | * | 5/2001 | Cho ........................ 438/240 |
| 6,319,766 | B1 | * | 11/2001 | Bakli et al. ............... 438/240 |
| 6,337,289 | B1 | * | 1/2002 | Narwankar et al. ....... 438/396 |
| 6,339,009 | B1 | * | 1/2002 | Lee et al. ................. 438/240 |
| 6,416,822 | B1 | * | 7/2002 | Chiang et al. ............ 427/561 |

OTHER PUBLICATIONS

U.S. patent application Ser. No. 09/179,921, Entitled *"Deposition Reactor Having Vaporizing, Mixing and Cleaning Capabilities,"* filed Oct. 27, 1998.

* cited by examiner

*Primary Examiner*—John F. Niebling
*Assistant Examiner*—Jennifer M. Kennedy
(74) *Attorney, Agent, or Firm*—Bozicevic, Field and Francis, LLP

(57) ABSTRACT

Processes which use the same precursor material for forming a metal electrode deposition as for forming a dielectric layer deposition. The layers may be successively formed in the same chamber, or may be formed in like chambers located in a processing system.

16 Claims, 7 Drawing Sheets

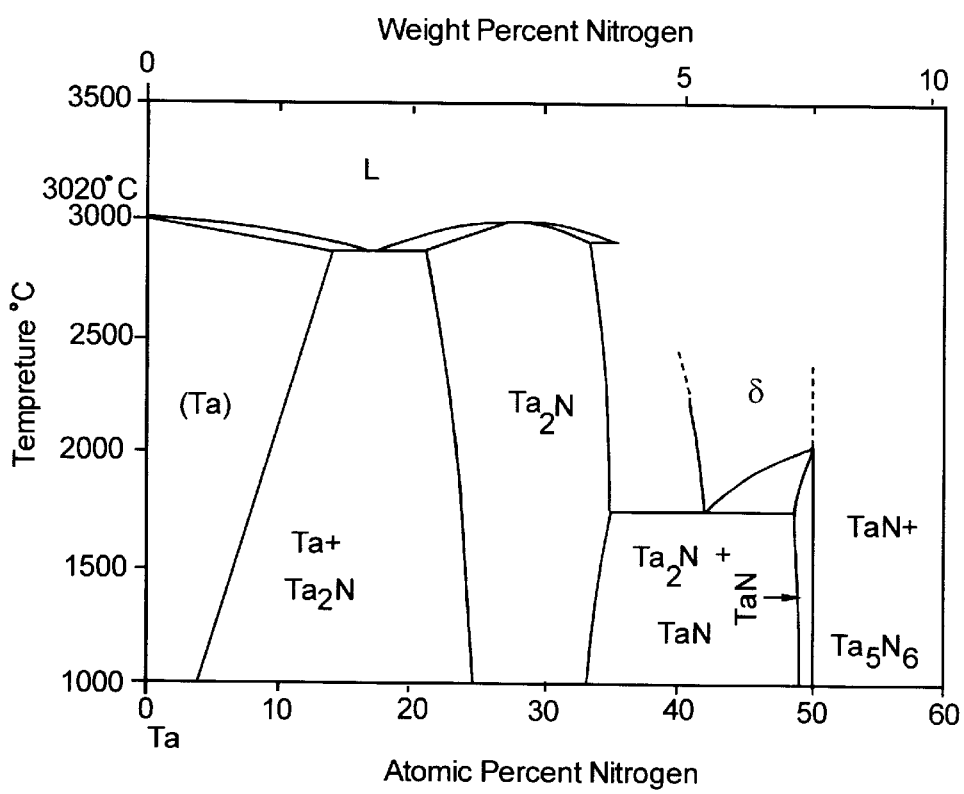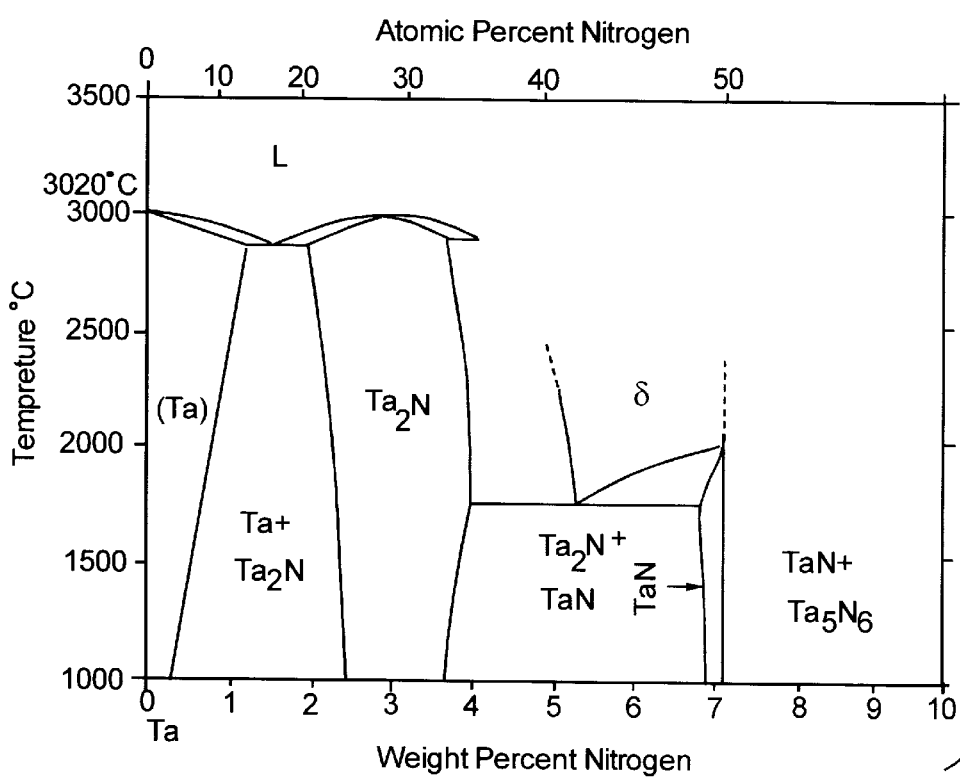
Fig.7

PROCESS FOR DEPOSITING LAYERS ON A SEMICONDUCTOR WAFER

FIELD OF THE INVENTION

The present invention relates to a process used in manufacturing a semiconductor device, and more particularly to a process used in manufacturing a stacked capacity element.

BACKGROUND OF THE INVENTION

The desire for greater capacity integrated circuits (ICs) on smaller sized devices has increased interest in replacing today's 64 megabit DRAM with memory devices in the range of 256 megabit, 1 gigabit and higher. This need for increased capacity in the same or smaller substrate footprint device makes it necessary to replace conventional dielectric films previously used in stacked capacitor formation, such as silicon dioxide ($SiO_2$), with dielectric films having higher dielectric films having higher dielectric constants. Several factors significantly limit the potential capacitance of a polysilicon/oxide/polysilicon capacitor formation. The deposition of the oxide layer invariably causes some oxidation of the polysilicon layer thereby decreasing its functionality as a conductor. The dielectric constant "k" for $SiO_2$ is about 4. The dielectric constant of SiN is about 7. Thus, if a SiN electrode is used in this type of formation, and the polysilicon layer becomes oxidized, thereby interfacing with the SiN layer, the effective dielectric constant of the SiN layer is compromised, resulting in an effective "k" value of somewhere between 4 and 7, thereby degrading the performance of the capacitor.

Additionally, for front end formation of capacitors, the polysilicon layer will often contact the silicon substrate and this results in a phenomenon known as "parasitic capacitance", which further degrades the potential capacitance of the polysilicon/oxide/polysilicon formation. Oxygen diffusion can be yet another concern for these types of structures.

Capacitors containing high-dielectric constant materials, such as $Ta_2O_5$, usually have much larger capacitance densities than standard $SiO_2$-$Si_3N_4$-$SiO_2$ stack capacitors making them the materials of choice in IC fabrication. High dielectric constant films are desirable because they provide higher capacitance which enables closer spacing of devices without electrical interference which can increase transistor density. One material of increasing interest for stack capacitor fabrication is Tantalum Oxide which has a relative dielectric constant more than six times that of $SiO_2$.

Deposition processes are employed to deposit thin films of insulative materials, as well as conductive, dielectric, ferroelectric and various other layers onto wafers. Such deposition has been performed through various well known processes, such as chemical vapor deposition ("CVD") and physical vapor deposition ("PVD" or "sputtering").

In a CVD process, a wafer is loaded into a chemical vapor deposition chamber. Conventional CVD processes supply reactive gases to the wafer surface where heatinduced chemical reactions take place to form a thin film layer over the surface of the wafer being processed. One particular CVD application is the deposition of a tantalum containing compound, such as tantalum oxide and tantalum nitride, which have dielectric constants on the order of 25 to 30. These compounds are deposited over a wafer from a process gas that includes a metallo-organic compound.

A carrier gas, such as helium, argon, nitrogen, or hydrogen brings the compound into the chamber, so that it may be infused with energy. The energy may be generated through a thermal heat source, in the case of thermal CVD, or a radio frequency ("rf") signal source, in the case of plasma enhanced CVD. The energized chemical vapor reacts with the wafer's surface to form a thin layer of material on the wafer.

In a sputtering process, a wafer is placed in a physical vapor deposition ("PVD") chamber, and the chamber is filled with a gas, such as argon. A plasma containing positively charged ions is generated from the gas, by creating an electrical field in the chamber. The positively charged ions accelerate and collide into a target material, which is mounted in the chamber. Atoms of the target material are thereby separated from the target and deposited on the wafer to form a layer of target material on the surface of the wafer.

In a traditional sputtering process, the bombardment of the target material by the positively charged ions is enhanced by providing a negative bias to the target material. This is achieved by providing a radio frequency signal to an electrode that supports the target material.

A separate RF signal may be inductively coupled to the chamber for generating positively charged ions in a high density plasma PVD chamber. A high density plasma PVD chamber may include another rf signal coupled to a wafer support for improving the attraction of the target material to the wafer.

A deposition chamber, such as a CVD chamber or a PVD chamber, may be used to deposit diffusion barriers in an integrated circuit. Diffusion barriers inhibit the diffusion of a contact metal, such as aluminum and copper, into the active region of a semiconductor device that is built on a silicon substrate. This prevents the interdiffusion of a contact metal into the substrate. Unlike an insulative layer of material, a diffusion barrier forms a conductive path through which current may flow. For example, a diffusion barrier may be employed to overlie a silicon substrate at the base of a contact hole.

A severe interdiffusion between a contact metal and a silicon substrate can begin to take place when the integrated circuit is heated to temperatures in excess of 450° C. If an interdiffusion is allowed to occur, the contact metal penetrates into the silicon substrate. This causes an open contact in the integrated circuit and renders the integrated circuit defective.

In the fabrication of integrated circuits, there has been an increased use of aluminum and copper metallization processes operating at high temperatures, in excess of 450° C. Therefore, it desirable to have diffusion barriers with a greater ability to inhibit the diffusion of contact metals, such as aluminum and copper.

In manufacturing an integrated circuit, it is desirable to perform successive steps of the manufacturing process in the same chamber ("in situ"). In situ operations reduce the amount of contamination that a wafer is exposed to by decreasing the number of times that the wafer is required to be transferred between different pieces of manufacturing equipment. In-situ operations also lead to a reduction in the number of expensive pieces of manufacturing equipment that an integrated circuit manufacturer must purchase and maintain.

Traditionally, in forming capacitive devices, a deposition of a metal electrode layer is performed in a chamber which is completely separate from a chamber used to deposit a subsequent dielectric layer. Again, a top layer electrode is deposited in a chamber separate from the process used to deposit the dielectric layer. A major concern is that oxidation of one or both electrode layers could occur if all layers were produced in situ, and this could make the electrode films resistive, or destroy their usefulness altogether.

Accordingly, it would be desirable to deposit two or more layers of nonconforming materials in situ, in the same chamber, for the many advantages that such a process would provide. It would further be desirable to use a single precursor material for the deposition formation of at least two layers of nonconforming materials in situ. It would further be desirable to increase the storage density of capacitive devices constructed by such techniques.

SUMMARY OF THE INVENTION

The present invention provides a process for manufacturing a buildup of layers on a semiconductor element, wherein a single precursor material can be used to provide multiple, different layers of the stacked element. A single process chamber may also be used, if desired. The process uses a single precursor element, e.g. tantalum, that can be provided with successively different chemical conditions to produce different layers having specific properties, e.g. a conductive layer followed by a diffusion barrier layer or a conductive layer followed by a dielectric layer. This process is particularly useful for MIM capacitors, as certain metals (e.g. tantalum) serves as a barrier layer or a conductive layer depending on the oxidative state of the metal.

More particularly, this invention relates to a method for the deposition of a high dielectric constant film, such as Tantalum Oxide ($Ta_2O_5$), on a conducting substrate, such as TaN, to make integrated circuits useful in the manufacture of DRAM modules and other semiconductor devices, and the products so produced.

According to one aspect of the invention, a method of making a capacitor structure includes the formation of a dielectric layer over a first electrode layer substrate. The dielectric layer is formed by introducing a precursor material into a chamber in which the substrate resides; introducing a first reactant into the chamber; and reacting the precursor material and the reactant to form and deposit the dielectric layer over the first electrode layer. A second electrode layer is formed over the dielectric layer, by introducing the same precursor material into a chamber in which the substrate, including the dielectric layer resides, and introducing a second reactant into the chamber. The precursor material and the second reactant react to form the material for the second electrode layer, which is deposited over the dielectric layer.

The dielectric layer may be annealed in the same or a similar chamber used to deposit the dielectric layer, prior to forming and depositing the second electrode layer. Semiconductor structures, e.g., MIM structures produced by the processes of the present invention are provided. A typical MIM structure includes a first metallic, conducting electrode layer; a dielectric layer having been formed from a precursor material and a first reactant and deposited on the first metallic layer; and a second metallic, conducting electrode layer having been formed from the same precursor material as used for the dielectric layer, and a second reactant.

These and other features of the invention will become apparent to those persons skilled in the art upon reading the details of the invention as more fully described below.

BRIEF DESCRIPTION OF THE DRAWINGS

FIG. 7 is a TA-N phase diagram showing the relative variations in resistivity among varying phases.

DETAILED DESCRIPTION OF PREFERRED EMBODIMENTS

Before the present processes are described, it is to be understood that this invention is not limited to particular processes described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that as used herein and in the appended claims, the singular forms "a", and, and "the" include plural referents unless the context clearly dictates otherwise. Thus, for example, reference to "a material" includes a plurality of such material and reference to "the device" includes reference to one or more devices and equivalents thereof known to those skilled in the art, and so forth.

Figure 1:
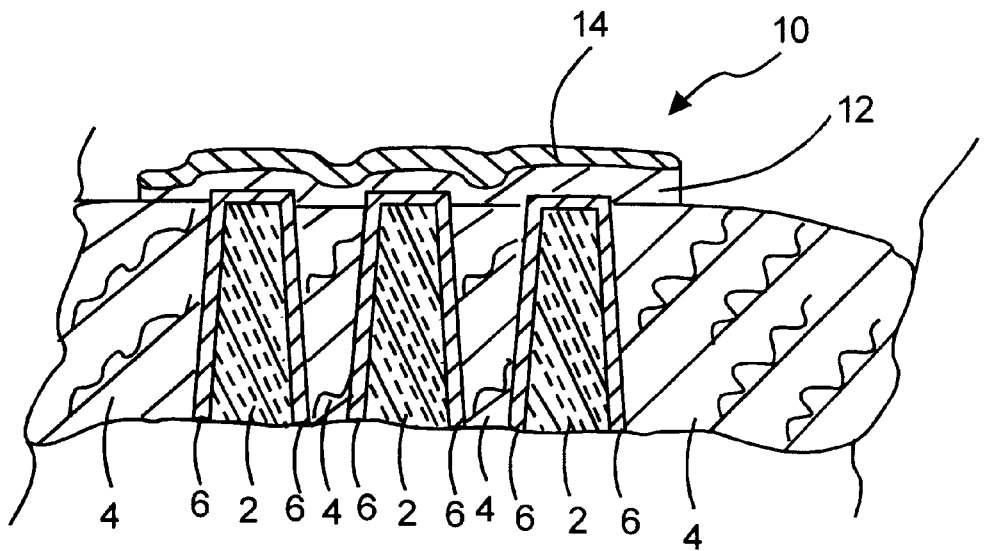
FIG. 1 is a partial sectional diagram of a back end product according to the present invention.

Referring to FIG. 1, a partial sectional view of a "back end" capacitor arrangement formed according to principles of the present invention described herein is shown. Various semiconductor applications, such as processors for use in cell phones, for example, and other applications that perform a significant amount of A/D or D/A conversion, require a very high percentage of the chip to be taken up by capacitor structures, such as decoupling capacitors, for example. For example, about 60% of the volume of a typical cell phone processor is occupied by capacitors required for the filtering network included therein.

For these types of applications, a "back end" production of the capacitor structure is currently preferred, wherein the capacitor structures are formed toward the end of the chip processing, typically between the last two levels of metals deposited on the wafer. One advantage of this approach, is that by removing the capacitors from being very close to the bottom silicon layer, the phenomenon of parasitic capacitance is greatly reduced, if not eliminated altogether. This leads to the additional advantage in that the capacitor structures may be made smaller and still give the same capacitance performance, or alternatively, will give enhanced capacitance performance when made the same size as those made in a front end process.

Although back ending the capacitor formation process offers some improvement in storage density, as described above, larger density capacitor structures are still necessary. For this reason, producers have turned to metal-insulator-metal construction of capacitors, since oxides of metals such as tantalum, ruthenium, titanium, etc, have a much higher dielectric constant than that of $SiO_2$. For example, $Ta_2O_5$ has a dielectric constant of about 25, as compared to the dielectric of $SiO_2$ of about 4.

Figure 2:
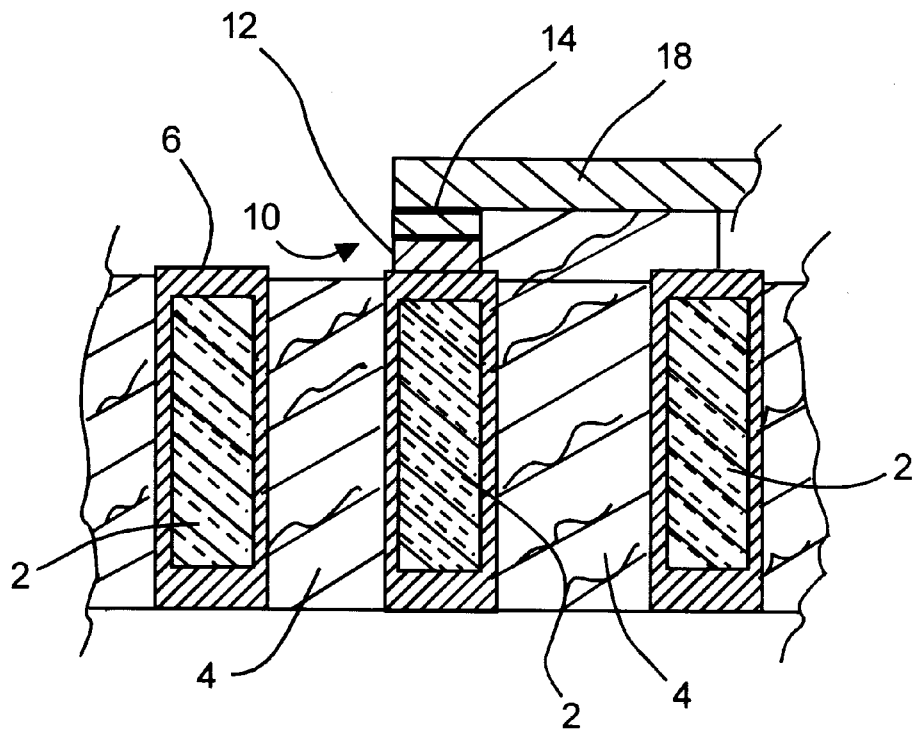
FIG. 2 schematically shows the arrangement of layers of an MIM capacitor according to the present invention.

The metal interconnects 2 at the back end of the wafer construction or chip are typically formed of a highly conductive metal such as copper or aluminum. The metal interconnects 2 are separated by insulative layers 4 of low "k" value material such as FSG, BLOK™ (formed from TEOS and He, Applied Materials, Santa Clara, Calif.), SILK™ (a low k dielectric formulation of Novellus Systems, Inc., San Jose, Calif.) or other carbon containing low k dielectric material. Surrounding the metal interconnects, or at least covering the metal interconnects at all interfacing surfaces, is a metallic layer 6 (e.g., see FIG. 2), formed from a material such as TaN or TiN, for example. Metallic layer 6 functions both as an oxidation barrier and a diffusion barrier with respect to the interfaces of the metallic interconnects 2.

An insulation layer 12 is deposited on top of the metallic interconnects 2, after which an additional conducting layer 14 is deposited. For example, if the metallic layer 6 is formed from TaN then the additional conducting layer may be (although not necessarily is) formed from TaN as well. Alternatively, the additional conducting layer may be formed from TiN or W, for example.

The metallic layer 6 may be deposited by PVD or CVD, among other processes. For example, when depositing by PVD, a tantalum target may be reaction sputtered with argon and nitrogen. A ratio of N/Ta which is deposited on the substrate can be around 0.26, for example. When the deposition of the metallic layer nears its end point, the nitrogen (e.g., $N_2$) input is closed such that a thin covering of pure tantalum (e.g., a monolayer) is deposited on the top surface of the metallic layer. By turning off the nitrogen input, avoidance of a high resistivity layer on top of the tungsten is accomplished. This improves hardware reliability and performance over an extended time.

The Ta monolayer can then be treated in a remote plasma process to convert the surface into a nitrogen rich composition to improve the barrier properties at the interface between the metallic layer and the insulation/dielectric layer. The surface is converted to have a N/Ta ratio of about 0.3 to about 1 to minimize oxygen scavenging of the insulation layer 12, particularly when the insulation layer comprises $Ta_2O_5$.

FIG. 7 is a phase diagram showing the various phases of a Ta-N system according to the percentage of nitrogen in the phase at a range of temperatures. In the top chart, nitrogen content is shown on an atomic percentage basis and the bottom chart shows nitrogen content on a weight percentage basis. Pure tantalum is, of course a conductor. As the percentage of nitrogen increases (moving to the right in the charts) the phases become increasing less conductive, as first phases which act as resistors appear, and then dielectrics.

Similarly, if the metallic layer 6 is formed from TiN, then the additional conducting layer may be formed from TiN, although not necessarily. The resultant structure formed atop the metallic interconnects 2 forms and functions as capacitor structure 10. A second metallic interconnect 18 is formed on the opposite side of the capacitor structure (relative to the side that the metallic interconnect 2 interfaces, see FIG. 2).

Advantageously, both insulation layer 12 and additional conduction layer 14 may be formed from the same (i.e., a single) precursor material, either in the same chamber in successive process steps, or in like adjacent chambers. The specific examples described below refer to precursors for forming tantalum and tantalum insulator structures. However, the same principles will apply to other suitable metal systems, such as titanium and titanium insulators, tungsten and tungsten insulators, and the like, for example.

One example of a single precursor process involves the use of t-butylimino tantalum (TBTDET), having a structural formula of $C_{16}H_{39}N_4Ta$, (, available from Schumacher, a unit of Air Products & Chemicals, Inc., of Carlsbad, Calif.) as a precursor. This precursor is reacted in an oxygen rich environment in a CVD chamber, for example to form $Ta_2O_5$, which is then deposited as the insulator or dielectric layer 12. The insulator layer 12 is next annealed in the same or a like chamber at less than about 450° C., preferably around 400° C. for about three minutes, for example, in a strong oxidizing environment, such as provided by a microwave remote plasma treatment, or for about ten minutes, for example in a weak oxidizing environment, such as provided by an inductively coupled remote plasma arrangement. Because this is a back end process and many metal layers are already existent on the substrate, the thermal budget is relatively low for this annealing process. After completing purging the chamber of oxygen, the second conductive layer 14 is deposited by reacting the precursor with an $NH_3$ rich environment in the chamber to form TaN, which is then deposited on top of the layer 12.

Figure 3:
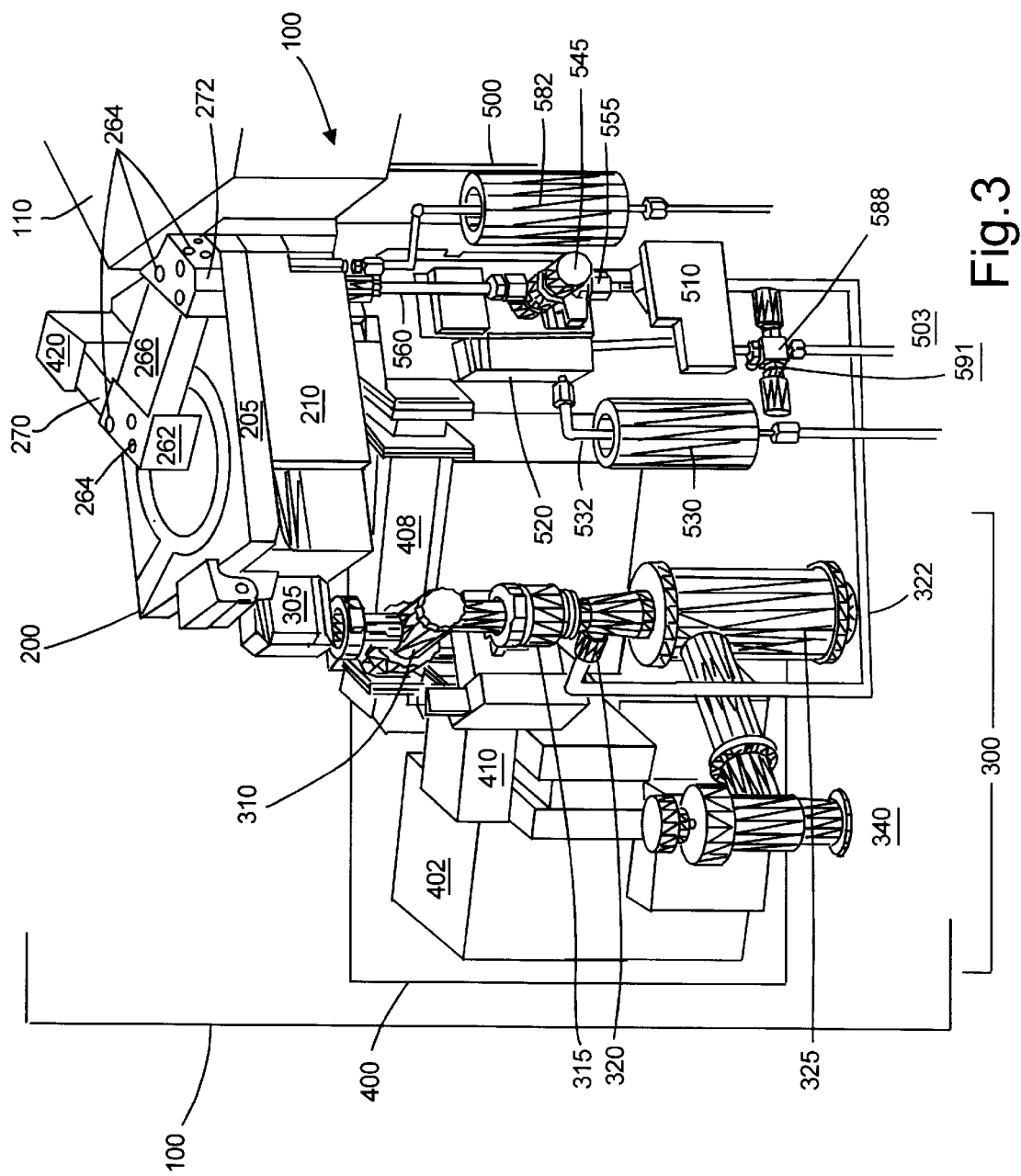
FIG. 3 is a perspective view of a processing system used in depositing layers according to the present invention.

FIG. 3 shows an example of a processing system 100 which may be used in depositing layers as described herein. System 100 contains a processing chamber 200, a heated exhaust system 300, a remote plasma generator 400 and a vapor delivery system 500. Also shown in FIG. 3 is a central substrate transfer chamber 110 representative of a cluster tool embodiment of the processing system. Processing chamber 200 is comprised of lid 205 and chamber body 210 and is attached to central transfer chamber 110. Gases supplied via liquid delivery system 500 are provided into a processing region 202 (not shown) within chamber 200 via temperature controlled conduits formed within inlet block 272, mixing block 226 and central block 262. Cartridge style heaters 264 are integrally formed into each block and, in conjunction with individual thermocouples and controllers, maintain temperature set points within the conduits. A more detailed description of the processing system 100 is provided in copending, commonly assigned application Ser. No. 09/179,921, entitled "Deposition Reactor Having Vaporizing Mixing and Cleaning Capabilities" filed on Oct. 27, 1998, which is hereby incorporated by reference in its entirety.

Chamber 200 processing by-products are exhausted via heated exhaust system 300 which is coupled to chamber 200 via exhaust port 305. Also shown are isolation valve 310, throttle valve 315, chamber by-pass 320 cold trap 325 and cold trap isolation valve 330. For clarity, specific embodiments of vacuum pump 335 and wafer fabrication plant exhaust treatment systems 340 are not shown. In order to provide a clearer representation of the interrelationship between and relative placement of each of the components of heated exhaust system 300, the jacket type heaters, thermocouples and controllers used to maintain set point temperatures in exhaust port 305, isolation valve 310, throttle valve 315, chamber by-pass 320 and by-pass line 322 have been omitted.

Activated species are generated by remote plasma generator 400 and provided to a processing region within chamber 200 via conduits within activated species inlet block 420, activated species block 270 and central block 262. Other components of remote plasma generator 400 such as magnetron 402, auto tuner controller 410, and auto tuner 408 are visible in FIG. 3.

One of the main components of liquid delivery system 500 is liquid flow meter 510 and vaporizer 520 three-way inlet valve 588 allows either precursor 503 or solvent 591 into vapor delivery system 500. Heat exchangers 530 and 582 preheat carrier gases and process gases respectively. Heated carrier gases travel via a carrier gas supply line 532 to vaporizer 520 in order to facilitate more complete vaporization within vaporizer 520 as well as carry vaporized liquids to chamber 200. After vaporization in vaporizer 520, chamber by-pass valve 545 allows vapor to be ported either to processing region 202 in chamber 200 via outlet 582 or to exhaust system 300 via outlet 555 which is coupled to heated by-pass line 322. A jacket style heater, thermocouple and controller which maintain the temperature of chamber by-pass valve 545 and vaporized precursor line 560 as well as the jacket style heater, thermocouple and controller which maintain the temperature of the by-pass line 322 have been omitted so as not to obscure the components of liquid delivery system 500 and their relationship to chamber 200 and heated exhaust system 300.

The size and dimensions of the various components and the placements of these components in relation to each other are determined by the size of the substrate in which the processes of the present invention are being performed. A preferred embodiment of the invention will be described herein with reference to a processing system 100 adapted to process a circular substrate, such as a silicon wafer, having a 200 mm diameter. Although described in reference to a single substrate, one of ordinary skill in the art of semiconductor processing will appreciate that the methods and various embodiments of the present invention are adaptable to the processing of multiple substrates within a single chamber 200.

Figure 4:
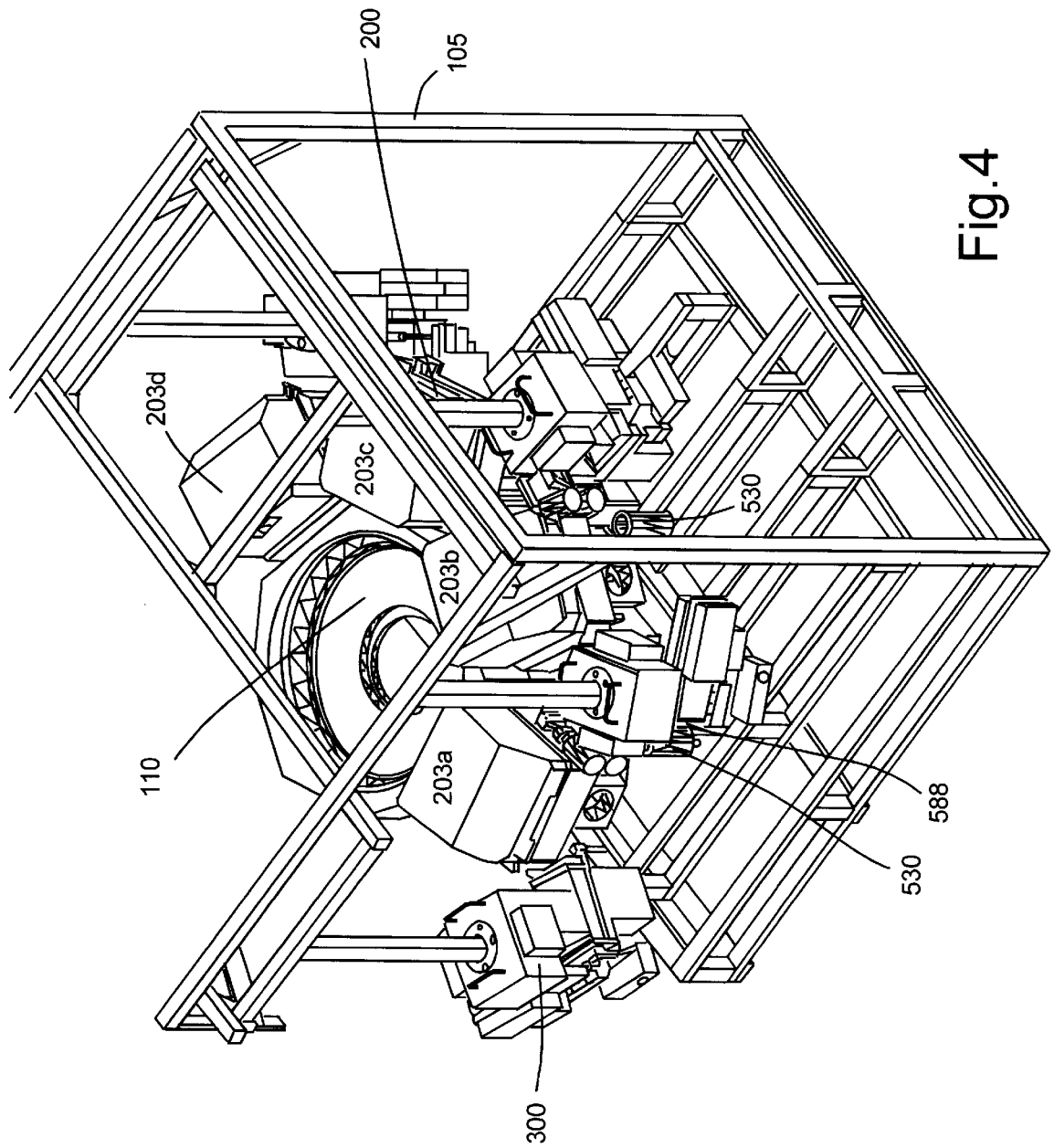
FIG. 4 is a perspective view of four processing systems of the type shown in FIG. 3, mounted on a typical central wafer handling system.

Turning now to FIG. 4, which is a perspective view of a plurality of processing systems 100 arranged in a cluster tool arrangement around central substrate transfer chamber 110 and supported by common mainframe support structure 105. The Centura® mainframe system, manufactured by Applied Materials, Inc. of Santa Clara, Calif., is representative of one such cluster tool arrangement. This arrangement allows multiple chambers, shown here comprising four processing systems 100 of the present invention, to share a common vacuum transfer 110. One advantage of such an arrangement is that the central substrate transfer also has attached to the central substrate transfer 110. Although FIG. 4 illustrates four identical processing systems 100, another advantage of the cluster tool arrangement is the ability to place a variety of chamber types onto a single central substrate transfer 110. In such an arrangement, a substrate may move between chambers arranged around central substrate transfer 110 without exposure to an air or oxygen ambient.

Chamber 200 is shown with protective cover 203 (i.e., 203a, 203b, 203c and 203d, respectively) in place. Cover 203 encloses heated chamber lid 205 and temperature controlled conduit blocks 272, 266 and 262. Cover 203 is maintained at a relatively safe temperature so as to prevent burn injuries from contact with the heated components of lid 205.

Remote plasma generator 400 is also shown in an alternative embodiment in which the generator is supported from the top of mainframe 105 instead of from below as shown in FIG. 3. So as not to obstruct the view of an alternative embodiment of remote plasma generator 400, heated exhaust system 300 is not shown. Such a support arrangement of remote plasma generator 400 provides easier accessibility and maintenance of other components of deposition system 100 as well as contributing to the reduction of the overall footprint of deposition system 100. The embodiment of the plurality of processing systems 100 of FIG. 4 further illustrates the compact design features of system 100.

According to the present invention, the deposition of insulative layer 12 may be performed in the processing system 100 including cover 203a, for example, after which the annealing process could be carried out in the system 100 including cover 203b. Next, the conductive layer 14 may be deposited in the chamber of the system 100 which includes cover 203c. Alternatively, both the insulative layer deposition process and annealing process can be carried out in the same chamber of the system 100 which includes cover 203a, and the conductive layer 14 deposition process could then be carried out in the chamber of the system 100 which includes cover 203b. This routine would allow similar, parallel processing in the chambers of the systems 100 which include covers 203c and 203d, respectively. Still further, all three processes may be successively carried out in a single chamber of a single system 100, allowing parallel simultaneous processing in each of the four systems. For example TaN may be used as a barrier layer and $Ta_3N_5$ may be used as a dielectric or insulative layer. In any case, the same precursor may be used in the formation of both the insulative layer 12 and the conductive layer 14, as explained above.

Another precursor which may be used in a tantalum—tantalum insulator system is ehtylimino tris(diethylamino) tantalum (EITDET-c), having a structural formula of $C_{14}H_{35}N_4Ta/C_{16}H_{39}N_4Ta$, available from Schumacher, a unit of Air Products & Chemicals, Inc., of Carlsbad, Calif. This precursor is reacted in an oxygen rich environment in a CVD chamber of a system, such as system 100, for example, to form $Ta_2O_5$ which is then deposited as the insulator or dielectric layer 12. The insulator layer 12 is next annealed in the same or a like chamber at less than about 450° C., preferably around 400° C. for about three minutes, for example, in a strong oxidizing environment, such as provided by a microwave remote plasma treatment, or for about ten minutes, for example in a weak oxidizing environment, such as provided by an inductively coupled remote plasma arrangement. After completing purging the chamber of oxygen, or in a like chamber, the second conductive layer 14 is deposited by reacting the precursor with an $NH_3$ rich environment in the chamber to form TaN, which is then deposited on top of the layer 12. Thus, even this type of layering can be laid down by successively carrying out all three processes in a single chamber of a single system 100, allowing parallel simultaneous processing in each of the four systems.

With regard to DRAM and e-DRAM (embedded DRAM) technology the current trend in semiconductor processors is toward smaller and smaller tech nodes (i.e., current tech node distances are 0.18 μm, in some cases 0.15 μm, and soon to be 0.13 μm). A result of such trend is that the "real estate" upon which to construct layered capacitors is shrinking, since these capacitors must physically exist between the gates of the transistors over which they are built. At the same time, a compounding effect is produced by a simultaneous trend of an ever increasing need for more storage capacity and information processing capability as the need to transfer larger and larger packages of information (such as video and audio files, for example) grows. Thus, these added constraints make it necessary to use MIM capacitor technology, since polysilicon technology does not afford a large enough dielectric constant, as explained above. Thus, front end construction of capacitor structures can also benefit from the present invention.

In this regard, a good deal of research has been conducted using Ru as a metal of choice. When oxidized to $RuO_2$, $RuO_2$ is a conductor, not a dielectric, and therefor does not incur the problem with parasitic capacitance that $SiO_2$ does in a polysilicon front end construction. Also, Ru easily etches to dimensions of 0.6 μm. However, the $RuO_4$ oxidation state of Ru is quite toxic. Although this oxidation state is not normally achieved, it will occur if Ru is exposed to hydrogen peroxide or $H_2SO_4$, for example. Accordingly, there are very real risks in using Ru based constructions.

TiN and W are also possible choices for MIM constructions. However, TiN diffuses into the insulator layer at the higher temperatures which are often used in front end processing. Because there are fewer constructs at the front end, and particularly metal constructs, the thermal budget is higher for front end processing than it is for back end processing. Accordingly, it is not unusual to use annealing temperatures of greater than 500° C. but less than about 700° C. in front end processing, as compared to around 400° C. when doing back end processing. These higher temperatures run the risk of diffusing TiN into the insulator layer. Also, oxidation of the TiN layer can be a problem. With regard to W, this metal also oxidizes, and $WO_3$ is volatile, which can result in the layer "peeling off" from the substrate. A TaN/$Ta_2O_5$ system, on the other hand, can be subjected to very high temperatures (e.g., up to about 800° C.) without exhibiting the problems described above with regard to TiN and W.

Figure 5:
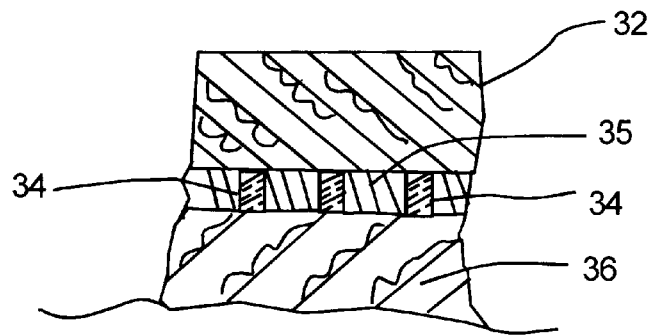
FIG. 5 is a partial sectional diagram of a starting block of insulator material used in forming a front end product according to the present invention.
Figure 6A:
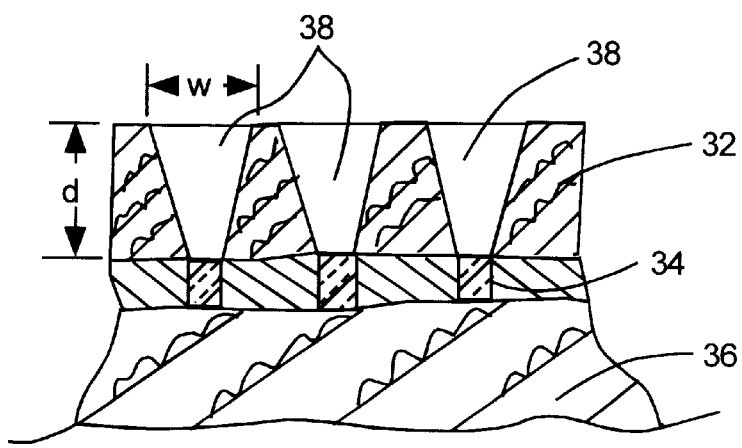
FIG. 6A is partial sectional view of the arrangement shown in FIG. 5 after further intermediate processing of the same.
Figure 6B:
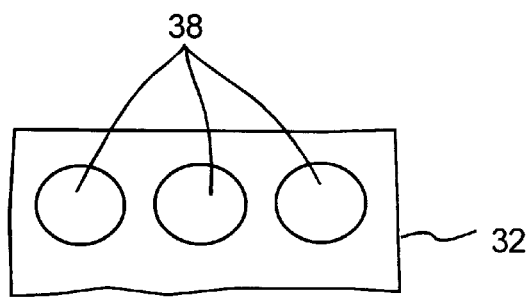
FIG. 6B is a top view of the arrangement shown in FIG. 6A.

Referring to FIG. 5, a preliminary stage in a front end construction of a capacitor assembly is shown. A block or layer of $SiO_2$ 32 is deposited over polysilicon plugs 34 which support layer 32 over an underlying logic structure 36 containing logic gates, etc. The polysilicon plugs 34 are surrounded by, or embedded in a low k dielectric material 35 of the type described above. Next, holes 38 are formed through layer 32 (see FIGS. 6A and 6B), by photoetching, for example, such that holes 38 are aligned with poly plugs 34, as can be seen in FIG. 6A. The aspect ratio (height or depth d divided by diameter w) of the holes is quite high and the trend has been to increase this ratio to provide greater surface area for capacitor formation. In the example shown, "d" is about 0.6 μm and w is about 0.05 μm. Because the holes formed are so narrow and deep, the construction of the capacitor structure must be performed by CVD, as the use of PVD results in too much build up of the layers on the walls of the holes, with an unacceptable thickness of the deposition layers towards and at the bottom of the holes. Accordingly, a CVD deposition system, such as that described above, is used for deposition of the following layers.

Figure 6C:
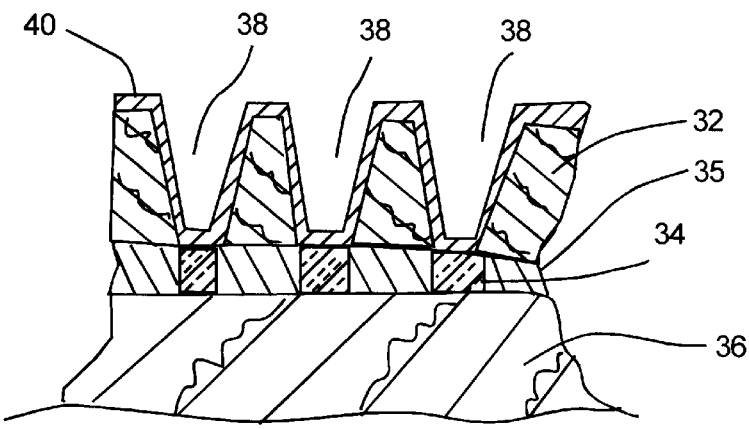
FIG. 6C is a sectional view of the arrangement shown in FIG. 6A, after a first metallic conducting layer has been deposited.

Referring to FIG. 6C, a first electrode layer 40 of TaN is deposited using one of the precursors described above, for example. A representative thickness of layer 40 may be from about 300 Å to about 500 Å, for example, although this may vary. Although not shown, a tantalum rich layer may be deposited at the bottom of each hole 38, prior to the deposition of layer 40. This deposition would act not only as a barrier layer but aids in the bonding of the layer 40 with the bottoms of the holes 38. This optional step is particularly employed when using TiN or TiAlN for the electrode layer 40, but is often unnecessary when using TaN for the electrode layer 40, since TaN tends to adhere very well to $SiO_2$.

Figure 6D:
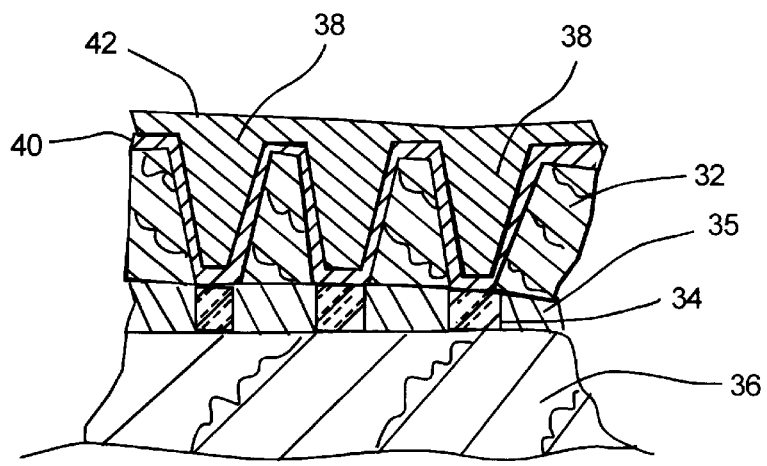
FIG. 6D is a sectional view of the arrangement shown in FIG. 6C, after an additional step of depositing a sacrificial layer.
Figure 6E:
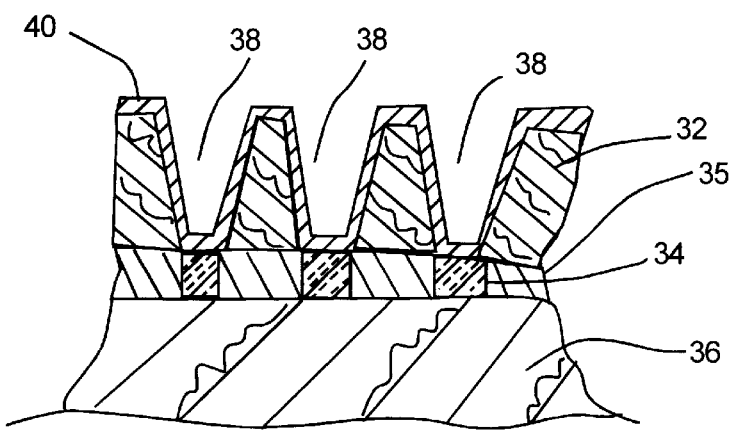
FIG. 6E is a sectional view of the arrangement shown in FIG. 6D, after removal of the sacrificial layer and interconnecting portions of the metallic layer.

After deposition of the electrode layer 40, the result is that the holes 38 all become electrically interconnected by this layer. The holes must be electrically separated or isolated if they are to function properly, so a sacrificial layer 42 (of, for example, $SiO_2$ or the like) is next deposited over the electrode layer 40, which also fills the holes 38, as shown in FIG. 6D. Next, the sacrificial layer 42, as well as the portions of the electrode layer 40 which interconnect the holes 38 are removed from the construct, preferably by CMP (chemical mechanical polishing) as shown in FIG. 6E, or by etching, for example. Additionally the sacrificial material 42 filling the holes 38 is removed by a wet etching process, with results as shown in FIG. 6E. Although not shown, the $SiO_2$ material surrounding the holes 38 and layer 40 may also be removed by etching to allow both sides of the layer 40 to be used for deposition of a dielectric layer thereover. Once the holes 38 have again been electrically isolated, the construct is ready for deposition of a dielectric layer.

Figure 6F:
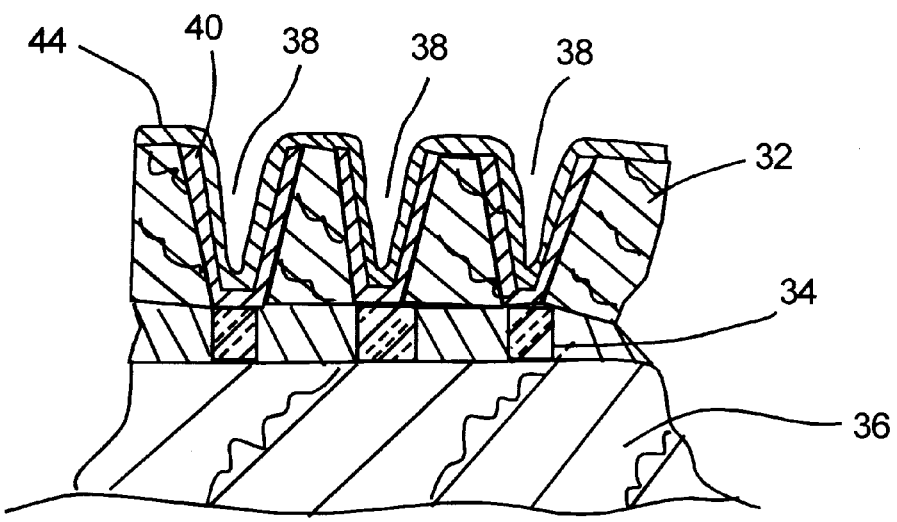
FIG. 6F is a sectional view of the arrangement shown in FIG. 6E, after deposition of a dielectric layer.

Referring to FIG. 6F, a dielectric layer 44, which in this example is $Ta_2O_5$, is next deposited. For this step, the construct may be placed in chamber 200 of the system 100 having cover 203a, for example, whereupon a precursor (two examples of which are described above) for forming $Ta_2O_5$ is introduced into the chamber, together with an oxygen rich ambient such as pure $O_2$ or ozone diluted with $O_2$. The precursor and the oxygen rich ambient react to form $Ta_2O_5$ which is deposited over the TaN layer 40 as dielectric layer 44.

After deposition is complete, an annealing step may be performed, either in the same chamber, or in the like chamber 200 of the adjacent system 100 that includes cover 203b. Because this is a front end process, the thermal budget is greater and RTP or rapid thermal processing may be used in this annealing step, where the annealing temperature may approach 700° C. for a period of about two minutes to thirty minutes.

Figure 6G:
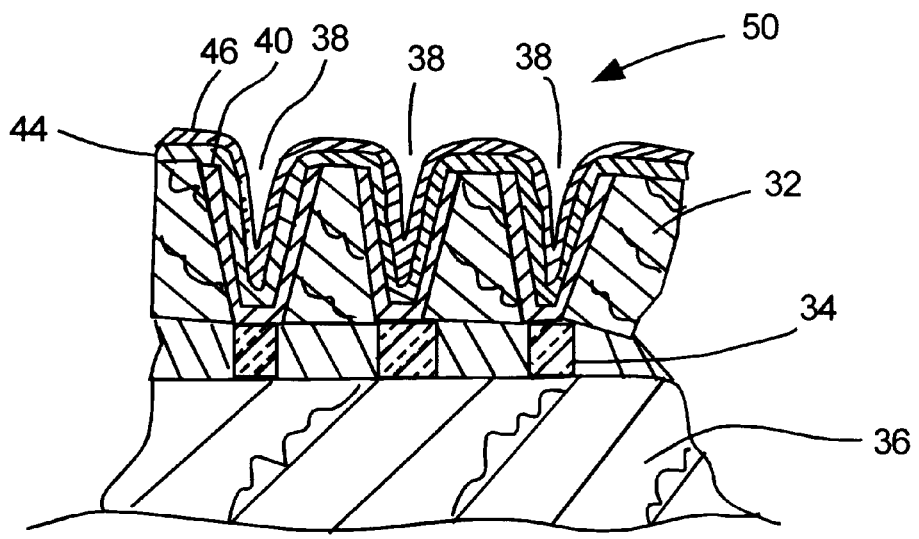
FIG. 6G is a sectional view of the arrangement shown in FIG. 6F, after an additional metallic conducting layer has been deposited.

After annealing and cooling the construct, a second electrode layer 46, which is, in this case TaN, is deposited over the dielectric layer 44, to form the capacitor structure 50, as shown in FIG. 6G. Similar to that mentioned above with regard to the back end processing, the TaN layer 46 may be deposited in the same chamber as was the dielectric layer 44, or may be deposited in the same chamber as the annealing process was conducted in, or may be deposited in a like chamber of a system 100 which includes cover 203c (FIG. 4). Advantageously, both insulation (or dielectric) layer 44 and additional conduction layer (or second electrode layer) 46 may be formed from the same (i.e., a single) precursor material.

Although the specific examples described above relate to deposition of $TaN/Ta_2O_5$, the same principles and methods apply equally to other suitable metal systems, such as $TiN/TiO_2$; or $TaN_2/Ta_3N_5$; or $TaN_2/Ta_2O_5$, for example. A precursor suitable for forming the $TiN/TiO_2$ layers is $TiCl_4$. Alternatively, TDMAT could be used, for example. The same reactant atmospheres can be used to form TiN and $TiO_2$ as are used to form TaN and $Ta_2O_5$, respectively. As to the $TaN_2/Ta_3N_5$ system, an $NH_3$ rich atmosphere is reacted with one of the precursors described above with respect to the $TaN/Ta_2O_5$ system, to produce either $TaN_2$ or $Ta_3N_5$, with the resultant product depending upon the relative concentrations of precursor and $NH_3$ rich atmosphere that exist during the reaction period. The same reactant atmospheres can be used to form $TaN_2$ and $Ta_2O_5$, as are used to form TaN and $Ta_2O_5$, respectively.

For example, precursors such as TBT-DET or EIT-DET or other precursors may also be used, with the criticality being that the precursor contains no oxygen. A carrier gas such as He or N2, for example may be flowed at about 300 sccm–1 slm. A Ta precursor may be inputted at about 25–100 mg/min and an $NH_3$ flow rate of about 500 sccm–2 slm may be used to establish a pressure of about 2–100 Torr at a deposition temperature of about 350° C.–450° C. for the formation of a TaN layer. The $Ta_2O_5$ layer may be formed using an input of a Ta precursor at about 25–150 mg/min and an $O_2$ or O3 flow rate of about 2 slm may be used to establish a pressure of about 2–100 Torr, preferably about 2–12 Torr, depending upon the application, at a deposition temperature of about 350° C.–450° C.

While the present invention has been described with reference to the specific embodiments thereof, it should be understood by those skilled in the art that various changes may be made and equivalents may be substituted without departing from the true spirit and scope of the invention. Although the above described processing is directed toward capacitor constructions, it is to be understood that such semiconductor circuit components can have application to other electrical structures, besides capacitors, in which a high-dielectric material is desired. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of making a capacitor structure comprising the steps of:
    forming a dielectric layer over a first electrode layer substrate, said forming a dielectric layer comprising the steps of:
        introducing a vapor formed from a tantalum containing liquid precursor comprising TBTDET or EITDET-c into a chamber in which the substrate resides;
        introducing a first reactant into the chamber; and
        reacting the vapor formed from the precursor comprising TBTDET or EITDET-c and the reactant to form and deposit the dielectric layer over the first electrode layer; and
    forming a second electrode layer over the dielectric layer, said forming a second electrode layer comprising the steps of:
        introducing the vapor formed from a tantalum containing liquid precursor comprising TBTDET or EITDET-c into a chamber in which the substrate, including the dielectric layer resides;
        introducing a second reactant into the chamber; and
        reacting the vapor formed from the precursor comprising TBTDET or EITDET-c and the second reactant to form and deposit the second electrode layer over the dielectric layer.

2. The method of claim 1, further comprising the step of annealing the dielectric layer prior to forming the second electrode layer.

3. The method of claim 1, wherein the first reactant is an oxygen rich ambient.

4. The method of claim 1, wherein the second reactant is a nitrogen rich ambient.

5. The method of claim 4, wherein the nitrogen rich ambient comprises $NH_3$.

6. The method of claim 1, wherein the chamber in which the substrate resides for deposition of the dielectric layer is the same chamber in which the substrate resides for deposition of the second electrode layer, and wherein the chamber is purged of the first reactant prior to commencing said forming the second electrode layer.

7. The method of claim 1, wherein said dielectric layer comprises $Ta_2O_5$.

8. The method of claim 1, wherein said second electrode layer comprises TaN.

9. A process for depositing successive layers of a semiconductor structure comprising the steps of:
    reacting a vapor of a tantalum containing precursor liquid comprising TBTDET or EITDET-c with a first reactant to form a dielectric layer to be deposited on a substrate; and
    reacting the vapor of a tantalum containing precursor liquid with a second reactant to form an electrode layer to be deposited on a substrate.

10. The process of claim 9, wherein said reacting the vapor of a tantalum containing precursor liquid with a first reactant and said reacting the vapor of a tantalum containing precursor liquid with a second reactant are carried out successively in a single chamber.

11. The process of claim 9, wherein said reacting the vapor of a tantalum containing precursor liquid with a first reactant and said reacting the vapor of a tantalum containing precursor liquid with a second reactant are carried out in similar chambers of a processing system.

12. The process of claim 9, wherein the first reactant comprises an oxygen rich ambient, and the second reactant comprises a nitrogen rich ambient.

13. The process of claim 12, wherein the second reactant comprises $NH_3$.

14. A method of making a capacitor structure comprising the steps of:
    forming a dielectric layer over a first electrode layer substrate, said forming a dielectric layer comprising the steps of:
        introducing a precursor material, selected from the group consisting of TBTDET and EITDET-c, into a chamber in which the substrate resides;
        introducing an oxygen rich ambient into the chamber; and reacting the precursor material and the oxygen rich ambient to form and deposit the dielectric layer over the first electrode layer; and forming a second electrode layer over the dielectric layer, said forming a second electrode layer comprising the steps of:
  introducing the precursor material into a chamber in which the substrate, including the dielectric layer resides;
  introducing a nitrogen rich ambient into the chamber; and
  reacting the precursor material and the nitrogen rich ambient to form and deposit the second electrode layer over the dielectric layer.

15. A process for depositing successive layers of a semiconductor structure comprising the steps of:
  reacting a tantalum containing precursor material with a first reactant comprising a nitrogen rich ambient to form a nitrogen containing dielectric layer to be deposited on a substrate; and
  reacting the tantalum containing precursor material with a second reactant comprising a nitrogen rich ambient to form an electrode layer to be deposited on a substrate.

16. A process for depositing successive layers of a semiconductor structure comprising the steps of:
  reacting a tantalum containing precursor material comprising TBTDET or EITDET-c with a first concentration of a reactant comprising a nitrogen rich ambient to form a dielectric layer to be deposited on a substrate; and
  reacting the tantalum containing precursor with a second concentration of the reactant to form an electrode layer to be deposited on the substrate including the dielectric layer, wherein the first and second concentrations are unequal.

* * * * *